United States Patent [19]
Nakamura

[11] Patent Number: 5,463,580
[45] Date of Patent: Oct. 31, 1995

[54] STATIC SEMICONDUCTOR MEMORY DEVICE HAVING IMPROVED READ OPERATION MARGIN AND SPEED

[75] Inventor: Kazuyuki Nakamura, Tokyo, Japan

[73] Assignee: NEC Corproation, Tokyo, Japan

[21] Appl. No.: 271,663

[22] Filed: Jul. 7, 1994

[30] Foreign Application Priority Data

Jul. 7, 1993 [JP] Japan .................................. 5-167577
Sep. 2, 1993 [JP] Japan .................................. 5-218293

[51] Int. Cl.$^6$ ............................................. G11C 13/00
[52] U.S. Cl. ................................ 365/189.01; 365/207
[58] Field of Search ..................... 365/189.01, 207, 365/206, 238

[56] References Cited

U.S. PATENT DOCUMENTS

| | | | |
|---|---|---|---|
| 4,916,667 | 4/1990 | Miyabayashi et al. | 365/207 |
| 4,932,002 | 6/1990 | Houston | 365/207 |
| 4,939,693 | 7/1990 | Tran | 365/207 |

*Primary Examiner*—Terrell W. Fears
*Attorney, Agent, or Firm*—Sughrue, Mion, Zinn, Macpeak & Seas

[57] ABSTRACT

In a semiconductor memory device including a plurality of word lines, a plurality of pairs of bit lines, a plurality of static memory cells, at intersections between the word lines and the pairs of bit lines, and at least one sense amplifier for sensing a difference in potential between a selected pair of bit lines, a resistive load is connected to a substantial center location of each of the bit lines.

10 Claims, 12 Drawing Sheets

STATIC SEMICONDUCTOR MEMORY DEVICE HAVING IMPROVED READ OPERATION MARGIN AND SPEED

BACKGROUND OF THE INVENTION

1. Field of the Invention

The present invention relates to a semiconductor memory device, and more particularly, to a static random access memory (SRAM) having an improved read operation margin and speed.

2. Description of the Related Art

A typical SRAM is comprised of a plurality of word lines, a plurality of pairs of bit lines, a plurality of static memory cells connected at intersections between the word lines and the pair of bit lines, and at least one sense amplifier for sensing a difference in potential between a selected pair of bit lines. Also, one resistive load is connected to each bit line, so as to generate the above-mentioned difference in potential between the selected pair of bit lines. That is, when one word line is selected, currents flow from the resistive loads into the memory cells connected to the selected word line, to generate a difference in potential between each of the pairs of bit lines. In this case, the potentials at the bit lines generated from the memory cells are propagated via the corresponding bit lines per se to the sense amplifier. Simultaneously, one of the pairs of bit lines is selected, i.e., one memory cell is selected, to complete a read operation for one selected memory cell. Thus, the read operation is dependent upon the resistance of the bit lines, since currents from the resistive loads flow via the bit lines to the memory cells.

In a prior art SRAM, however, a row of resistive loads are connected at bit line locations far away from the sense amplifier. As a result, when a selected memory is far away from the resistive loads, i.e., close to the sense amplifier, an unnecessary large reduction in potential is generated in the bit lines due to the long length of the bit lines between the resistive loads and the selected memory cell. As a result, the difference in potential between the pair of bit lines connected to the selected memory device is quite large, thus deteriorating the read operation margin. Also, this large difference in potential decreases the read-operation speed. This will be explained later in detail.

Also, in another prior art SRAM, a row of resistive loads are connected at locations on the bit lines close to the sense amplifier. As a result, when a selected memory is far away from the resistive loads, i.e., far way from the sense amplifier, the speed of a read operation is very low due to the long length of the bit lines between the resistive loads and the selected memory cell. This will be explained later in detail.

Particularly, recently, as the integration of SRAM's has advanced, the length of bit lines has been increased while the width of bit lines has been decreased. This further decreases the read operation speed and further deteriorates the read operation margin.

SUMMARY OF THE INVENTION

It is an object of the present invention to provide an SRAM having an improved read operation speed and margin.

According to the present invention, in a semiconductor memory device including a plurality of word lines, a plurality of pairs of bit lines, a plurality of static memory cells at intersections between the word lines and the pairs of bit lines, and at least one sense amplifier for sensing a difference in potential between a selected pair of bit lines, a resistive load is connected to a substantial center location of each of the bit lines. Thus, since a substantial maximum length of the bit lines between the resistive load and a selected memory cell is reduced, the reduction in potential caused by the resistance of the bit lines is decreased so that the difference in potential between a selected pair bit lines is not so large.

BRIEF DESCRIPTION OF THE DRAWINGS

The present invention will be more clearly understood from the description as set forth below, as compared with the prior art, with reference to the accompanying drawings, wherein.

DESCRIPTION OF THE PREFERRED EMBODIMENTS

Before the description of the preferred embodiments, prior art SRAM's will be explained with reference to FIGS. 1 through 6.

Figure 1:
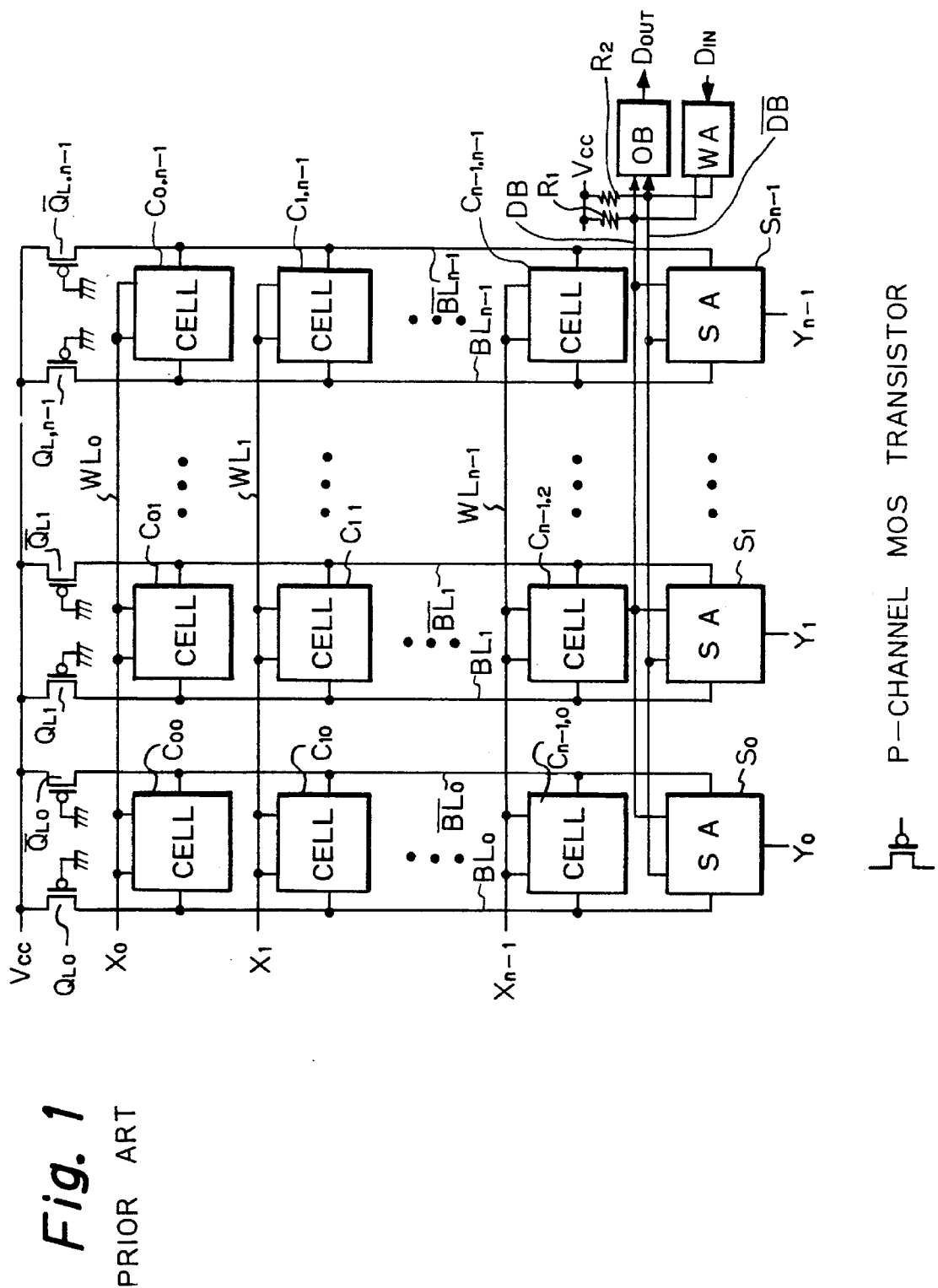
FIG. 1 is a block circuit diagram illustrating a prior art SRAM.

In FIG. 1, which illustrates a prior art SRAM, static memory cells, $C_{00}$, $C_{01}$, . . . , $C_{n-1}$ of a flip-flop type are provided at intersections between word lines $WL_0$, $WL_1$, . . . , $WL_{n-1}$ and pairs of bit lines $BL_0$, $\overline{BL}_0$; $BL_1$, $\overline{BL}_1$; . . . ; $BL_{n-1}$, $\overline{BL}_{n-1}$. Provided on one side of each of the bit lines $BL_0$, $\overline{BL}_0$, . . . $BL_{n-1}$, $\overline{BL}_{n-1}$ are resistive loads $Q_{L0}$, $\overline{Q}_{L0}$, . . . , $Q_{L, n-1}$, $\overline{Q}_{L, n-1}$ which are connected to a power supply terminal $V_{cc}$. In this case, the resistive loads are formed by P-channel MOS transistors whose gates are grounded. Also, provided on the other side of each pair of the bit lines $BL_0$, $\overline{BL}_0$, . . . , $BL_{n-1}$, $\overline{BL}_{n-1}$ are sense amplifiers $S_0$, $S_1$, . . . $S_n$. One of row selection signals $X_0$, $X_1, \ldots, X_{n-1}$ is made high to select one of the word lines $WL_0, WL_1, \ldots, WL_{n-1}$, and one of column selection signals $Y_1, Y_2, \ldots, Y_{n-1}$ is made high to select one of the sense amplifiers $S_0, S_1, \ldots, S_{n-1}$, i.e., one pair of the bit lines $BL_0$, $\overline{BL}_0$, $BL_1$, $\overline{BL}_1$, ..., $BL_{n-1}$, $\overline{BL}_{n-1}$, thus selecting one memory cell.

The sense amplifiers $S_0, S_1, \ldots, S_{n-1}$ are commonly connected via data buses DB and $\overline{DB}$ to resistors $R_1$ and $R_2$, an output buffer OB which generates an output data signal $D_{OUT}$, and a write amplifier WA which receives an input data signal $D_{IN}$.

Figure 2:
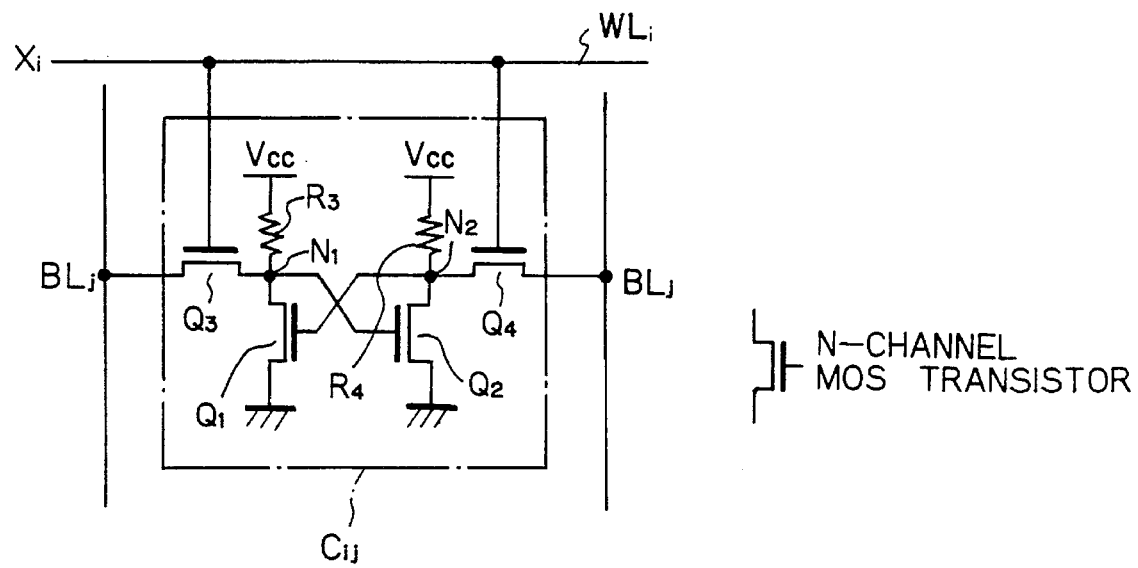
FIG. 2 is a circuit diagram of the memory cell of FIG. 1.

As illustrated in FIG. 2, each of the memory cells $C_{ij}$ (i,j=0,1, ..., n-1) is formed by two resistors $R_3$ and $R_4$, and cross-coupled N-channel MOS transistors $Q_1$ and $Q_2$ serving as a flip-flop, and N-channel MOS transistors $Q_3$ and $Q_4$ serving as transfer gates. The state of the flip-flop is defined by potentials at nodes $N_1$ and $N_2$. The N-channel MOS transistor $Q_3$ ($Q_4$) is connected between the bit line $BL_j$ ($\overline{BL}_j$) and the node $N_1$ ($N_2$), and is controlled by the row selection signal $X_i$ at the word line $WL_i$. Note that the resistors $R_3$ and $R_4$ can be formed by P-channel MOS transistors whose gates are grounded or N-channel MOS transistors whose gages are clamped at a high potential.

For example, assume that the potentials at the nodes $N_1$ and $N_2$ are low and high, respectively, and accordingly, the transistors $Q_1$ and $Q_2$ are turned ON and OFF, respectively. In this state, during a read operation mode for the memory cell $c_{ij}$ where the row selection signal $X_i$ is made high, the potentials at the bit lines $BL_j$ and $\overline{BL}_j$ are made low and high, respectively. In this case, the potential $V_1$ (see FIG. 4) at the bit line $BL_j$ is determined by $$V_1 = V_{cc} \cdot (R(Q_1) + R(Q_3))/(RL + R(Q_1) + R(Q_3)) \qquad (1)$$

where RL is the resistance of the resistive load $Q_{Lj}$;

R ($Q_1$) is the resistance of the transistor $Q_1$; and

R ($Q_3$) is the resistance of the transistor $Q_3$.

Conversely, the potential $V_2$ (see FIG. 4) at the bit line $\overline{BL}_j$ is $V_{cc}$. Therefore, in this case, the difference $\Delta V$ (see FIG. 4)

$$\Delta V = V_2 - V_1 = V_{cc} \cdot RL/(RL + R(Q_1) + R(Q_3)) \qquad (2)$$

is supplied to the sense amplifier $S_j$.

Figure 3:
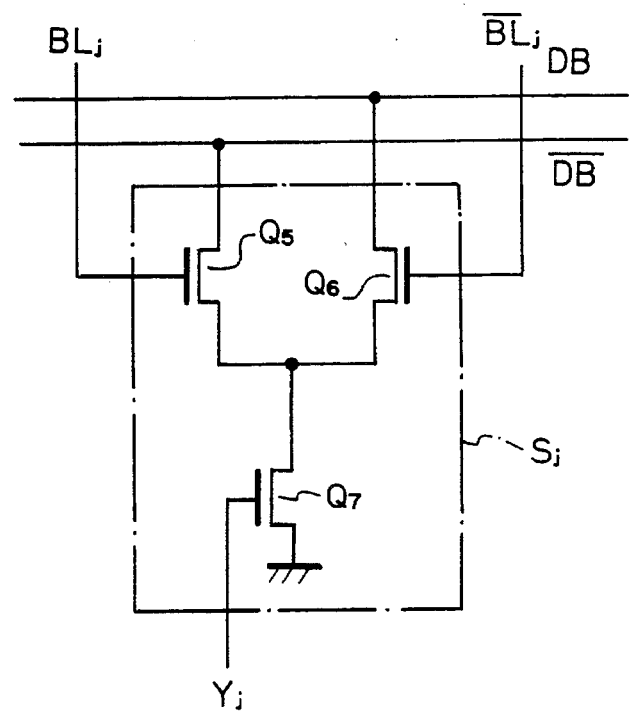
FIG. 3 is a circuit diagram of the sense amplifier of FIG. 1.

Also, as illustrated in FIG. 3, the sense amplifiers $S_j$ (j=0.1, ..., n-1) is formed by an N-channel MOS transistor $Q_5$ connected to the data bus $\overline{DB}$, an N-channel MOS transistor $Q_6$ connected to the data bus DB, and an N-channel MOS transistor $Q_7$ connected to the MOS transistors $Q_5$ and $Q_6$. The transistors $Q_5$ and $Q_6$ are controlled by the potentials at the bit lines $BL_j$ and $\overline{BL}_j$, respectively, the transistor $Q_7$ is controlled by the column selection signal $Y_j$. As a result, when the potential at the bit line $BL_j$ is higher than the potential at the bit line $\overline{BL}_j$, the potential at the data bus DB is higher than the potential at the data bus $\overline{DB}$. Conversely, when the potential at the bit line $BL_j$ is higher than the potential at the bit line $\overline{BL}_j$, the potential at the data bus DB is higher than the potential at the data bus $\overline{DB}$.

Figure 4:
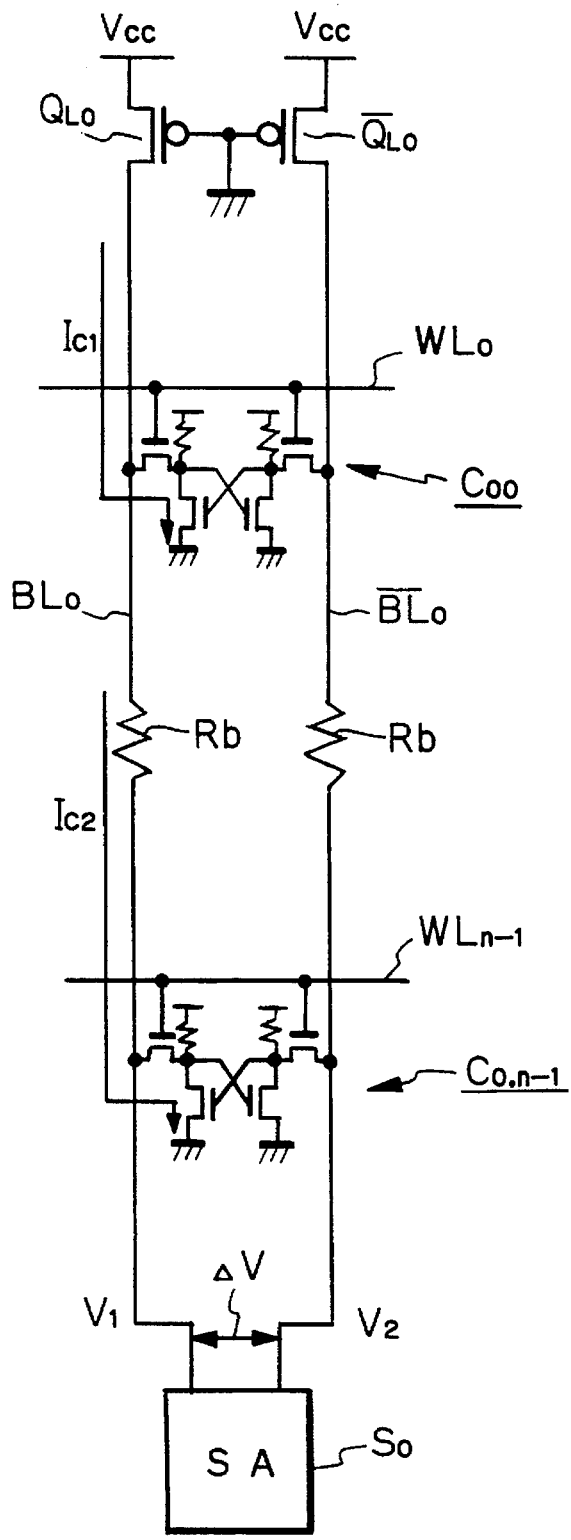
FIG. 4 is a partial diagram of the SRAM of FIG. 1 showing the operation thereof.

In the SRAM of FIG. 1, however, the potential $V_1$ at the lower potential side bit line as defined by the equation (1) and the difference $\Delta V$ as defined by the equation (2) are dependent upon the location of a selected memory cell. That is, as illustrated in FIG. 4, when a memory cell, such as $C_{00}$, close to the resistive loads $Q_{L0}$ and $\overline{Q}_{L0}$ is selected, a current $I_{c1}$ flows from the resistive load $Q_{L0}$ to the memory cell $C_{00}$. As a result, the potential $V_1$ at the bit line $BL_0$ is substantially given by the equation (1), and the difference $\Delta V$ is also given by the equation (2). However, when a memory cell, such as $C_{n-1, 0-1}$, far away from the resistive loads $Q_{L0}$ and $\overline{Q}_{L0}$, i.e., close to the sense amplifier $S_0$, is selected, is selected a current $I_{c2}$ flows from the resistive load $Q_{L0}$ via the bit line $BL_0$, whose effective resistance is Rb, to the memory cell $C_{n-1, 0}$. As a result, the potential $V_1$ at the bit line $BL_0$ is determined by $$V_1 = V_{cc} \cdot (R(Q_1) + R(Q_3))/(RL + Rb + R(Q_1) + R(Q_3)) \qquad (3)$$

Therefore, the difference $\Delta V$ is $$\Delta V = V_2 - V_1 \qquad (4)$$
$$= (RL + Rb)/(RL + Rb + R(Q_1) + R(Q_2))$$

Thus, the difference $\Delta V$ in potential supplied to the sense amplifier $S_0$ is increased as compared with the equation (2), thus deteriorating a read operation speed. Also, such a large difference $\Delta V$ supplied to the sense amplifier $S_0$ decreases a read operation speed.

Figure 5:
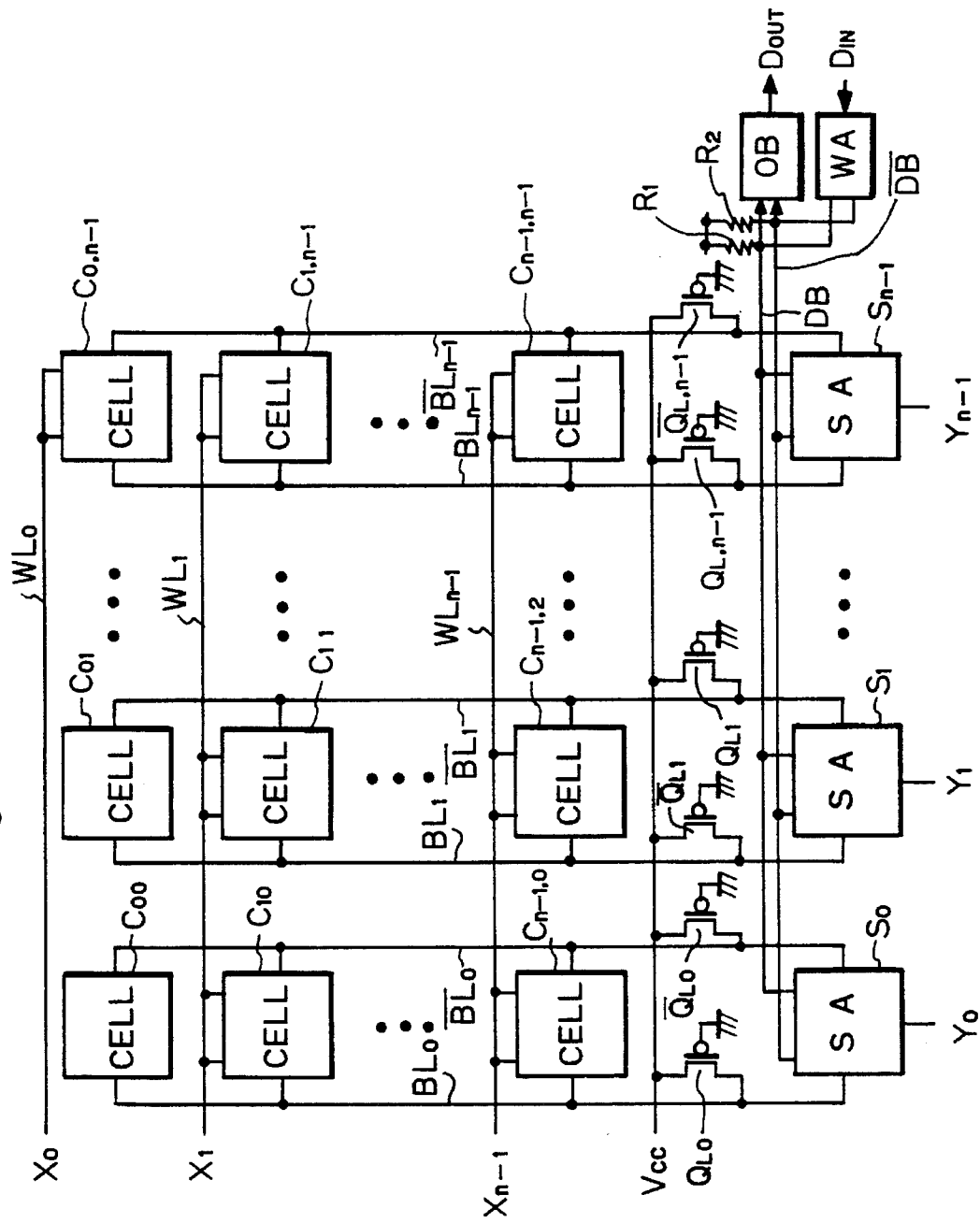
FIG. 5 is a block circuit diagram illustrating another prior art SRAM.
Figure 6:
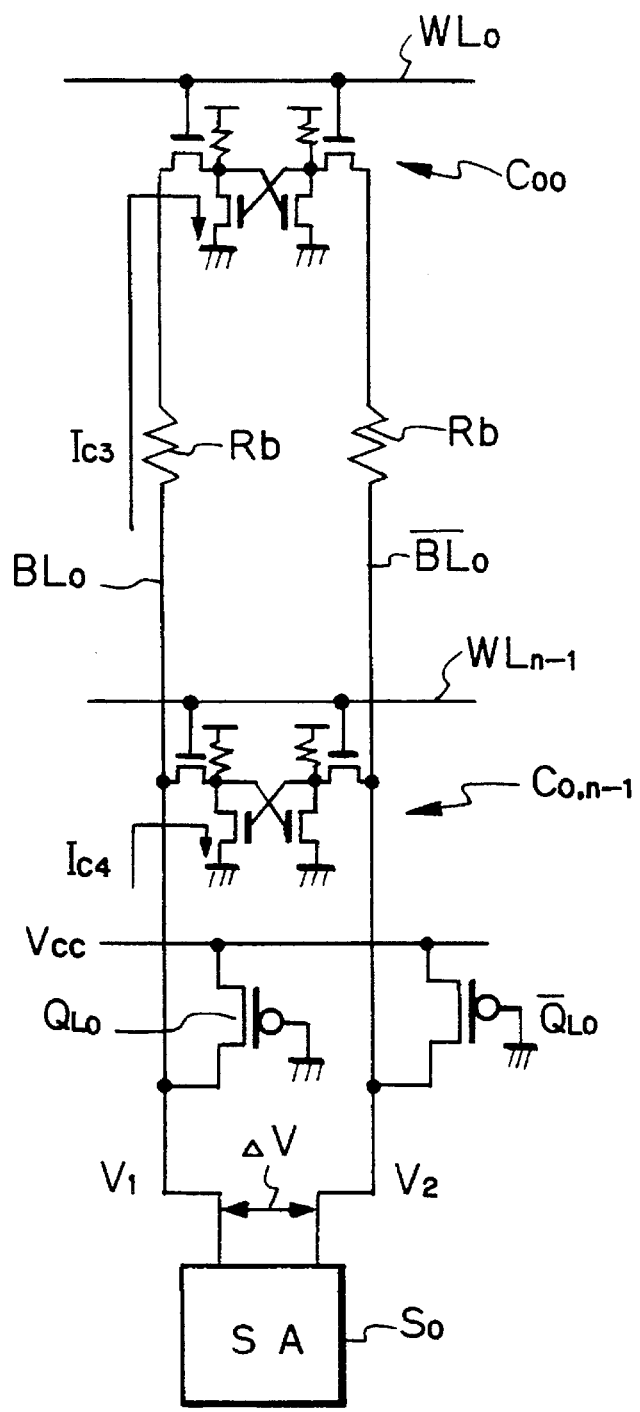
FIG. 6 is a partial diagram of the SRAM of FIG. 5 showing the operation thereof.

In FIG. 5, which illustrates another prior art SRAM, the resistive loads $Q_{L0}, \overline{Q}_{L0}, Q_{L1}, \overline{Q}_{L1}, \ldots, Q_{L, n-1}, \overline{Q}_{L, n-1}$ are connected to the bit lines $BL_0, \overline{BL}_0, BL_1, \overline{BL}_1, \ldots, BL_{n-1}$, $\overline{BL}_{n-1}$ on the same side of the sense amplifiers $S_0, S_1, \ldots, S_{n-1}$. In this case, as illustrated in FIG. 6, when a memory cell, such as $C_{00}$, far away from the resistive loads $Q_{L0}$ and $\overline{Q}_{L0}$, i.e., the sense amplifier $S_0$ is selected, a current $I_{c3}$ flows from the resistive load $Q_{L0}$ via the bit line $BL_0$, whose effective resistance is Rb, to the memory cell $C_{00}$. As a result, the potential $V_1$ at the bit line $BL_0$ is determined by $$V_1 = V_{cc} \cdot (Rb + R(Q_1) + R(Q_3))/(RL + Rb + R(Q_1) + R(Q_3)) \qquad (5)$$

Therefore, the difference $\Delta V$ is $$\Delta V = V_2 - V_1 \qquad (6)$$
$$= RL/(RL + Rb + R(Q_1) + R(Q_3))$$

Also, when a memory cell, such as $C_{n-1, 0}$, close to the resistive loads $Q_{L0}$ and $Q_{L0}$, i.e., close to the sense amplifier $S_0$, is selected, a current $I_{c4}$ flows from the resistive load $Q_{L0}$ to the memory cell $C_{0, n-1}$. As a result, the potential $V_1$ at the bit line $BL_0$ is substantially given by the equation (1), and the difference $\Delta V$ is also given by the equation (2). Thus, the difference $\Delta V$ in potential supplied to the sense amplifier $S_0$ is not increased much. However, when a memory cell, such as $C_{00}$, far away from the sense amplifier $S_0$ is selected, a pulling up operation by the current $I_{c3}$ upon the bit line $BL_0$ is delayed due to the effective resistance Rb, thus decreasing a read operation speed.

Figure 7:
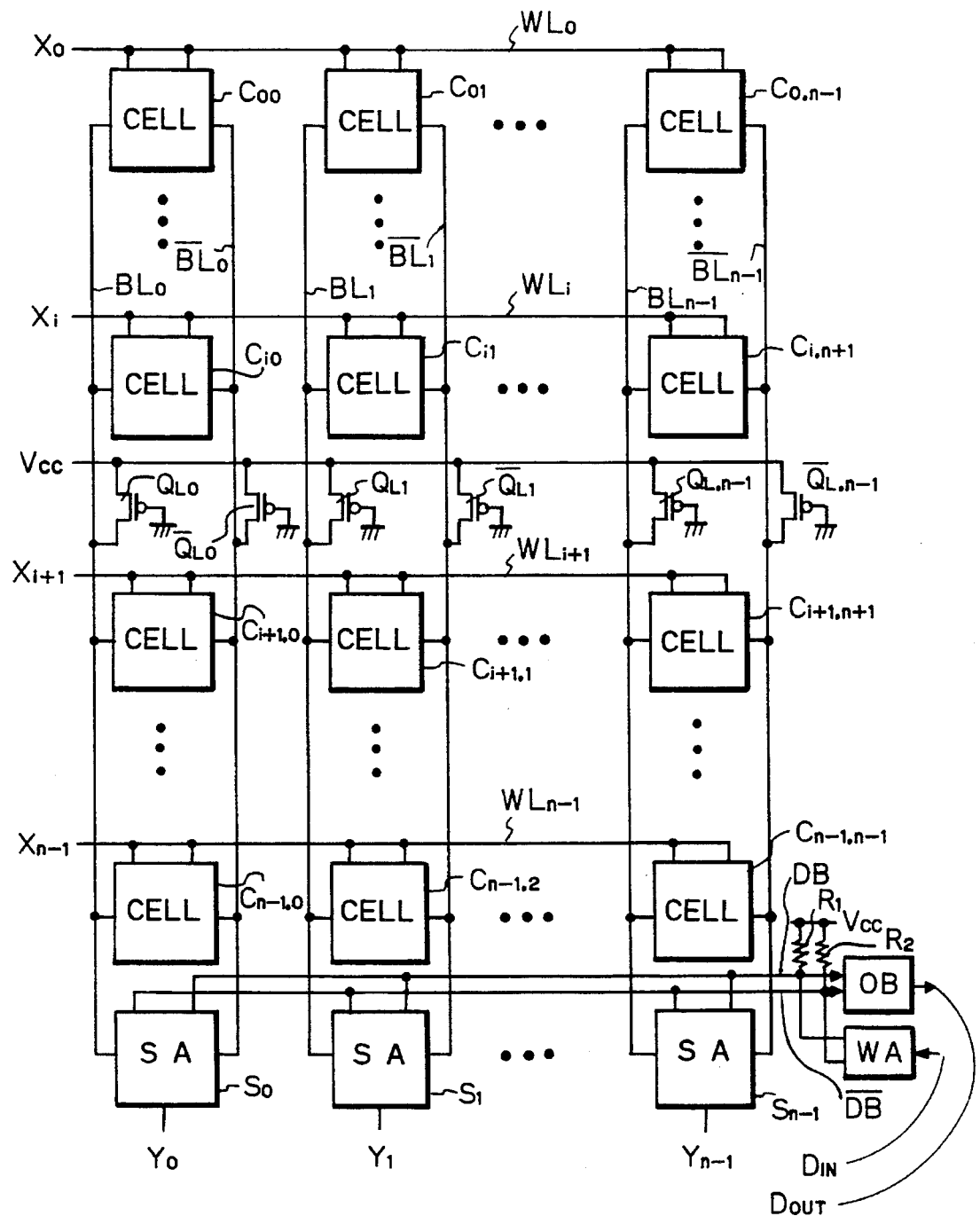
FIG. 7 is a block circuit diagram illustrating a first embodiment of the SRAM according to the present invention.
Figure 8:
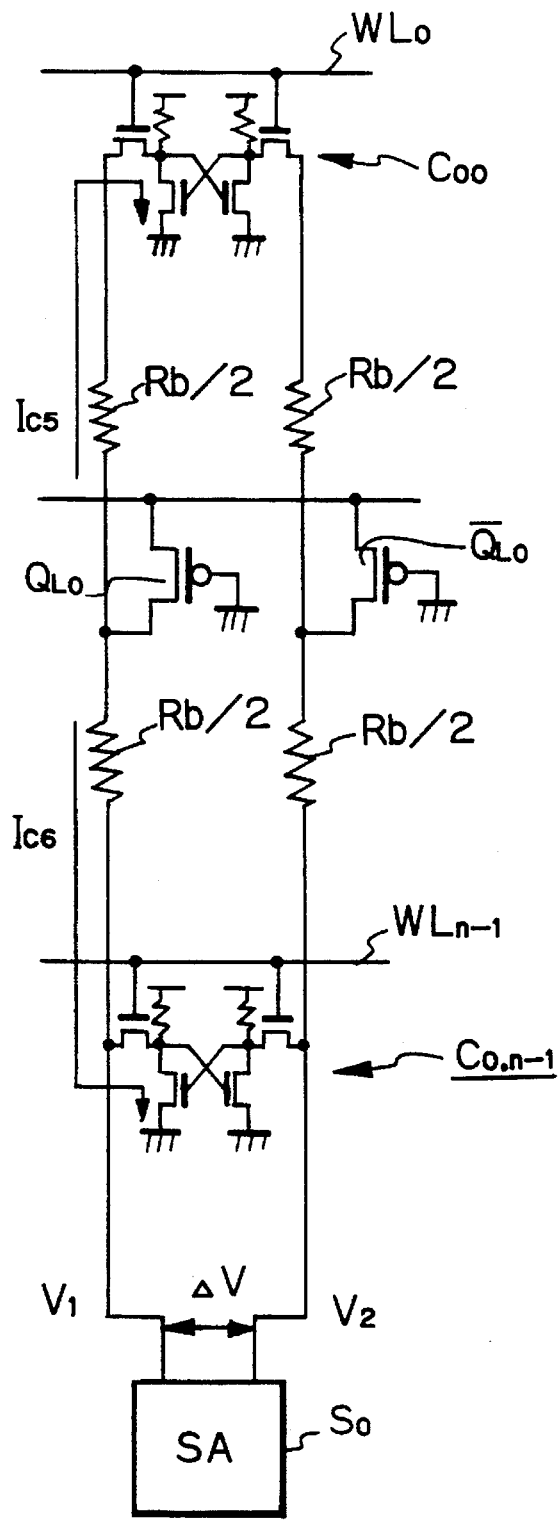
FIG. 8 is a partial diagram of the SRAM of FIG. 7 showing the operation thereof.

In FIG. 7, which illustrates a first embodiment of the present invention, the resistive loads are connected to substantial center locations of the bit lines $BL_0, \overline{BL}_0, BL_1$, $\overline{BL}_1, \ldots, BL_{n-1}, \overline{BL}_{n-1}$. That is, the resistive loads $Q_{L0}$, $\overline{Q}_{L0}, Q_{L1}, \overline{Q}_{L1}, \ldots, Q_{L, n-1}, \overline{Q}_{L, n-1}$ are located between the word line $WL_i$ and the word line $WL_{i+1}$. For example, if the SRAM is of a 16 Mbit type where n equals 4096, i equals 2047, or preferably a value, such as 1500, less than 2047. As illustrated in FIG. 8, when a memory cell, such as $C_{00}$, far away from the sense amplifier $S_0$ is selected, a current $I_{c5}$ flows from the resistive load $Q_{L0}$ via the bit line $BL_0$, whose effective resistance is Rb/2, to the memory cell $C_{00}$. As a result, the potential $V_1$ at the bit line $BL_0$ is determined by $$V_1 = V_{cc} \cdot (Rb/2 + R(Q_1) + R(Q_3))/(RL + Rb/2 + R(Q_1) + R(Q_3)) \qquad (7)$$

Therefore, the difference $\Delta V$ is $$\Delta V = V_2 - V_1 \quad (8)$$
$$= RL/(RL + Rb/2 + R(Q_1) + R(Q_3))$$

As a result, the potential $V_1$ at the bit line $BL_0$ is also given by the equation (7), and the difference $\Delta V$ is also given by the equation (8). Also, when a memory cell, such as $C_{0, n-1}$, close to the sense amplifier $S_0$, is selected a current $I_{c6}$ flows from the resistive load $Q_{L0}$ to the memory cell $C_{0, n-1}$. Thus, the difference $\Delta V$ in potential supplied to the sense amplifier $S_0$ is so increased much. Simultaneously, when a memory cell, such as $C_{00}$, far away from the sense amplifier $S_0$ is selected, a pulling up operation by the current $I_{c3}$ upon the bit line $BL_0$ is not so delayed due to the effective resistance $Rb/2$, thus improving a read operation speed.

Figure 9:
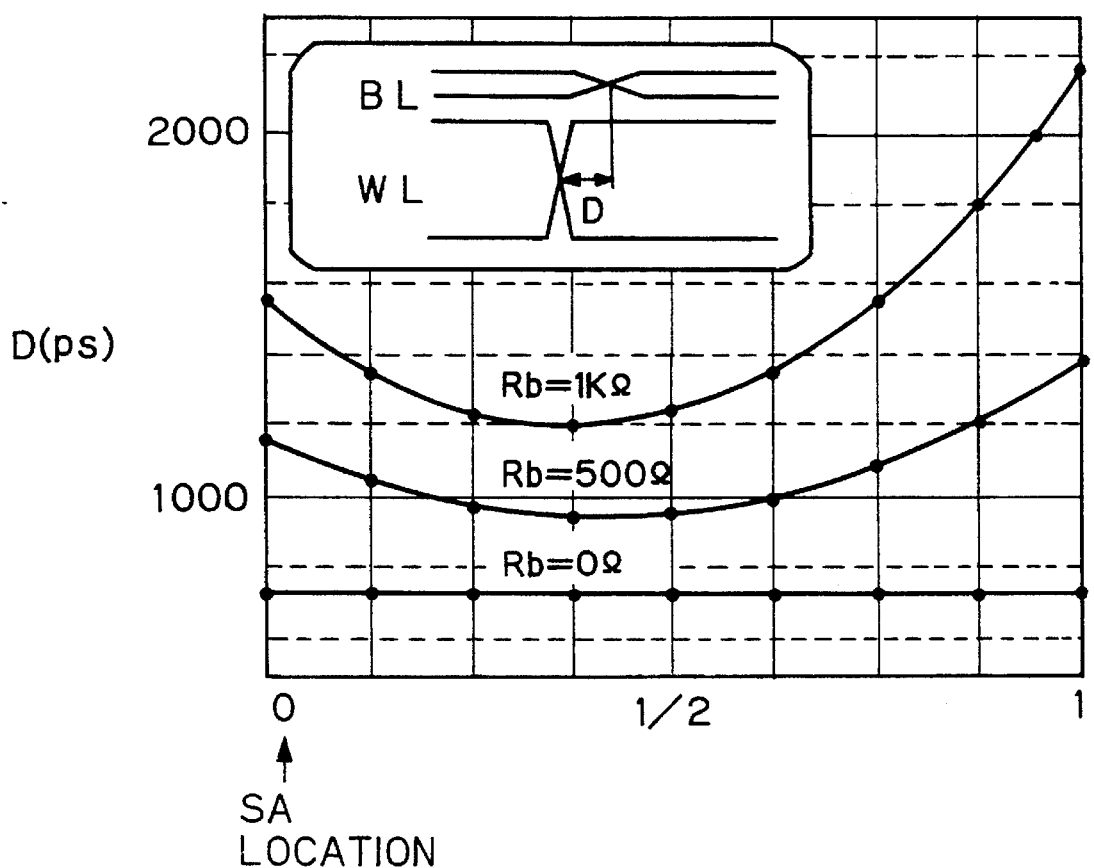
FIG. 9 is a graph for showing the operation of the SRAM of FIG. 7.

As shown in FIG. 9, a relationship between the relative location of the resistive loads $Q_{L0}, \overline{Q}_{L0}, Q_{L1}, \overline{Q}_{L1}, \ldots, Q_{L, n-1}, \overline{Q}_{L, n-1}$ with respect to the bit lines $BL_0, \overline{BL}_0, BL_1, \overline{BL}_1, \ldots, BL_{n-1}, \overline{BL}_{n-1}$ and the delay time D in a 16 Mbit SRAM, the delay time D is remarkably dependent upon the relative location of the resistive loads $Q_{L0}, \overline{Q}_{L0}, Q_{L1}, \overline{Q}_{L1}, \ldots, Q_{L, n-1}, \overline{Q}_{L, n-1}$ when the resistance Rb of the bit line, such as $BL_0$, is larger. Also, FIG. 9 shows that, when the resistive loads $Q_{L0}, \overline{Q}_{L0}, Q_{L1}, \overline{Q}_{L1}, \ldots, Q_{L, n-1}, \overline{Q}_{L, n-1}$ are a little closer to the sense amplifier $S_0, S_1, \ldots, S_{n-1}$ from a center location of the bit lines $BL_0, \overline{BL}_0, BL_1, \overline{BL}_1, \ldots, BL_{n-1}, \overline{BL}_{n-1}$, the delay time D is minimum.

Figure 10:
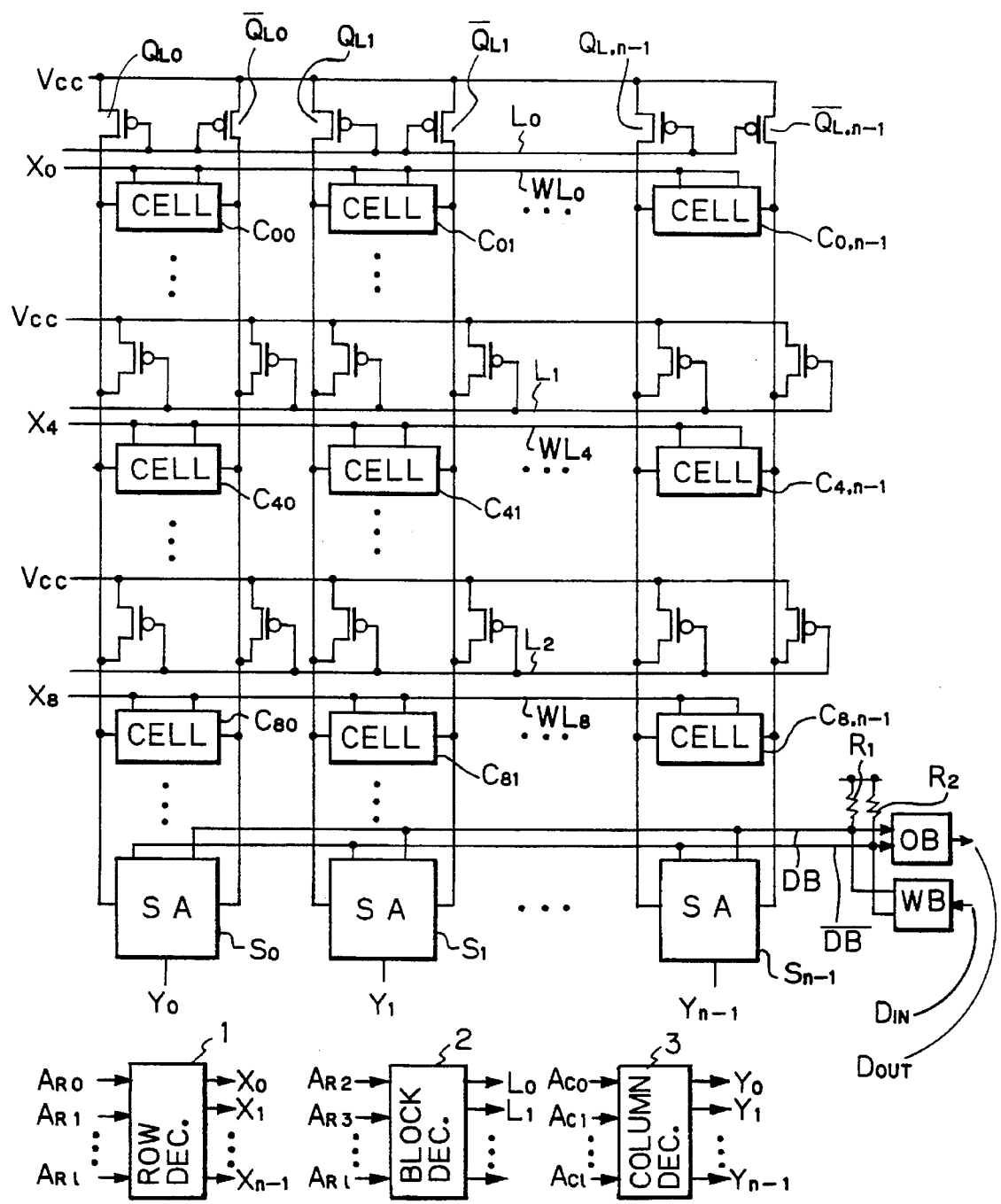
FIG. 10 is a block circuit diagram illustrating a second embodiment of the SRAM according to the present invention.

In FIG. 10, which illustrates a second embodiment of the present invention, a plurality of rows of the resistive loads $Q_{L0}, \overline{Q}_{L0}, Q_{L1}, \overline{Q}_{L1}, \ldots, Q_{L, n-1}, \overline{Q}_{L, n-1}$ are provided. For example, one row of the resistive loads $Q_{L0}, \overline{Q}_{L0}, Q_{L1}, \overline{Q}_{L1}, \ldots, Q_{L, n-1}, \overline{Q}_{L, n-1}$ are provided for every four word lines. In this case, as illustrated in FIG. 10, a row decoder 1 receives l-bit row address signals $A_{R0}, A_{R1}, \ldots, A_{Rl}$ ($n=2^l$) to select one of the word lines $WL_0, WL_1, \ldots, WL_{n-1}$ and make its row selection signal $X_0, X_1, \ldots,$ or $X_{n-1}$ high, while a block decoder 2 receives (l–2)-bit row address signals $A_{R2}, A_{R3}, \ldots, A_{Rl}$ to select one of the load lines $L_0, L_1, \ldots$ and make its potential low. On the other hand, a column decoder 3 receives l-bit row address signals $A_{C0}, A_{C1}, \ldots, A_{Cl}$ ($n=2^l$) to select one of column selection signals $Y_0, Y_1, \ldots, Y_{n-1}$ and make its potential high.

In FIG. 10, in order to perform a high speed precharging operation or equalizing operation upon the bit lines $BL_0, \overline{BL}_0, BL_1, \overline{BL}_1, \ldots, BL_{n-1}, \overline{BL}_{n-1}$, two or more load lines $L_0, L_1, \ldots$ can be simultaneously made low. For example, as illustrated in FIG. 11, a control circuit 4 is provided to generate a control signal $\phi$ which is made high in a read standby state after a write operation, and as a result, when the control $\phi$ is high, all of the load lines $L_0, L_1, \ldots$ are made low to pull up all of the bit lines $BL_0, \overline{BL}_0, BL_1, \overline{BL}_1, \ldots, BL_{n-1}, \overline{BL}_{n-1}$.

Figure 12:
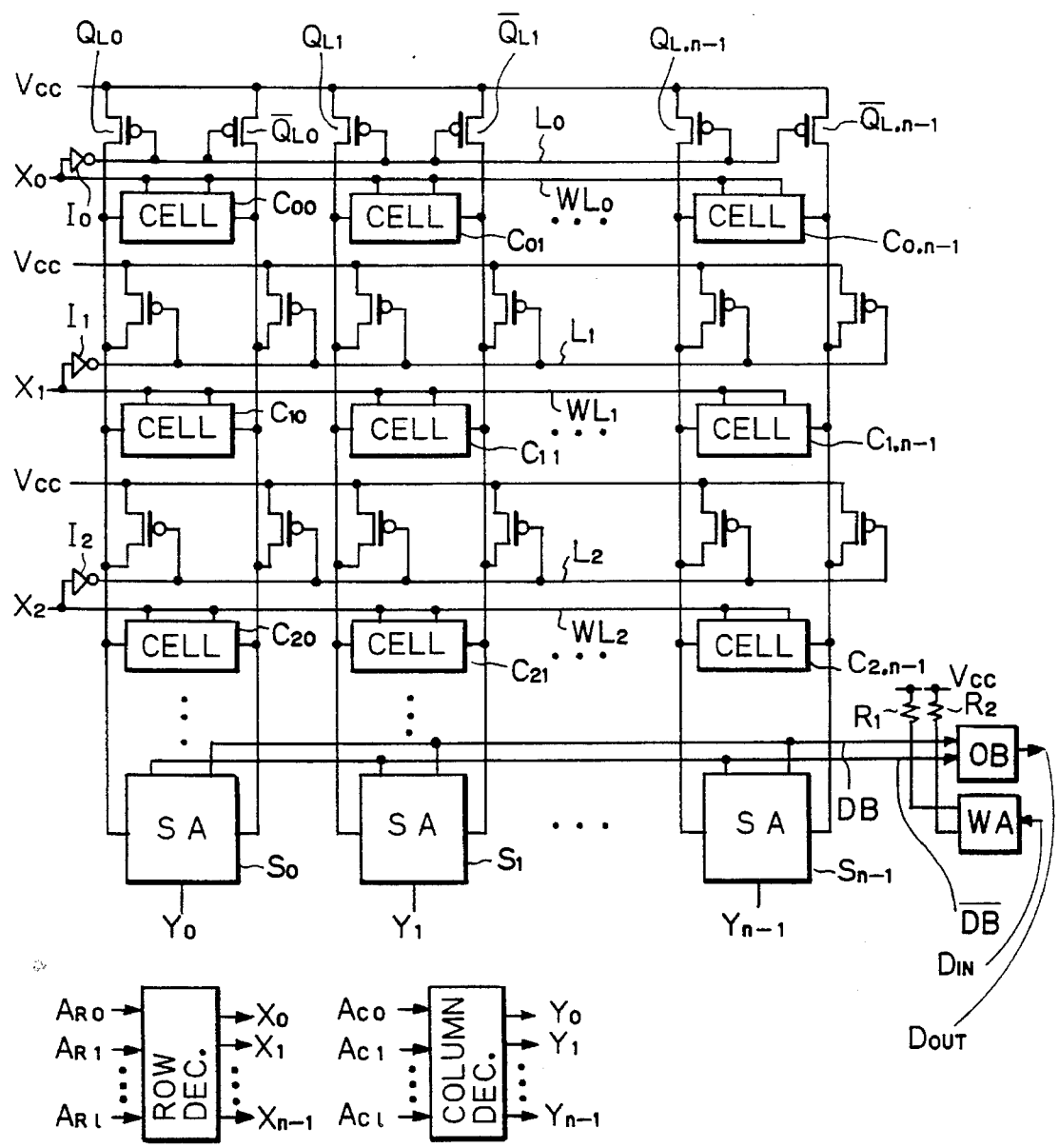
FIG. 12 is a block circuit diagram illustrating a third embodiment of the SRAM according to the present invention.

In FIG. 12, which is illustrates a third embodiment of the invention, one row of the resistive loads $Q_{L0}, \overline{Q}_{L0}, Q_{L1}, \overline{Q}_{L1}, \ldots, Q_{L, n-1}, \overline{Q}_{L, n-1}$ is provided for one of the word lines $WL_0, WL_1, \ldots, WL_{n-1}$. In this case, inverters $I_0, I_1, \ldots$ are provided instead of the block decoder 2 of FIG. 10. For example, when the word line $WL_0$ is selected and made high, the load line $L_0$ is selected and made low.

Figure 11:
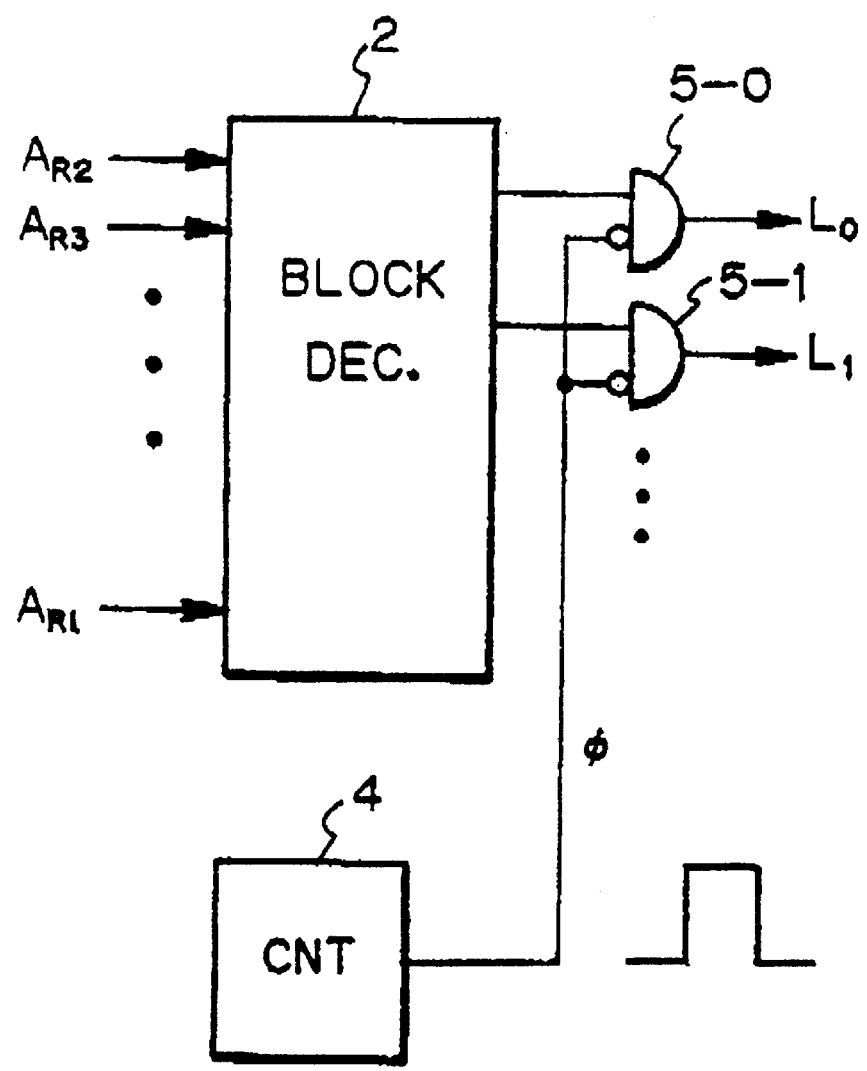
FIG. 11 is a block circuit diagram of a modification of the SRAM of FIG. 10.

In any of FIGS. 10 and 11, when a memory cell is selected, a current flows from a resistive load located close to the selected memory cell. As a result, an effective resistance of the bit line, such as $BL_0$ affecting the difference in potential supplied to the sense amplifier $S_0$ can be small and uniform, thus improving the read operation margin. This also contributes to increasing the read operation speed.

Figure 13:
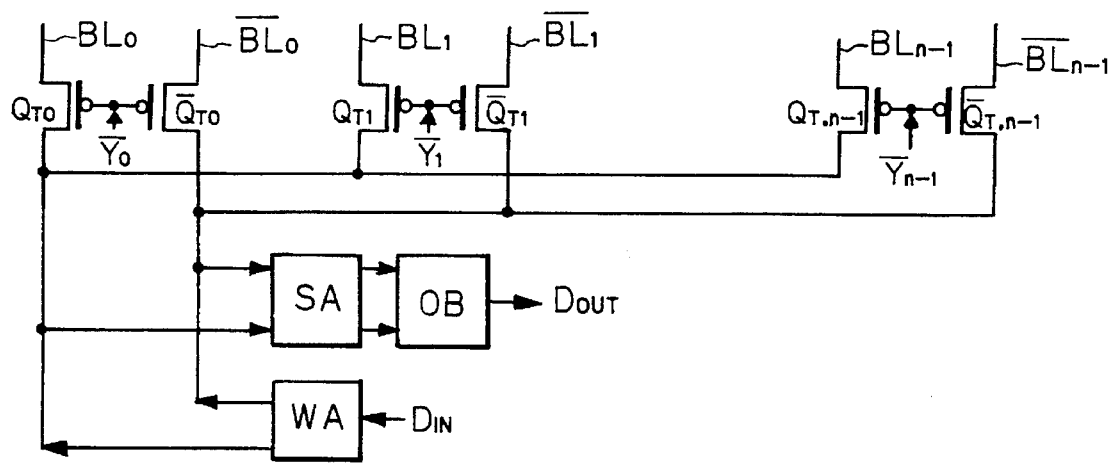
FIG. 13 is a circuit diagram of a modification of the SRAM's of FIGS. 7, 10 and 12.
Figure 14:
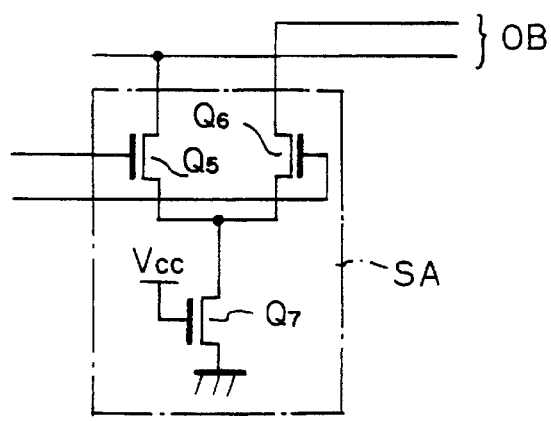
FIG. 14 is a circuit diagram of the sense amplifier of FIG. 13.

Although the above-described embodiments are applied to an SRAM having a plurality of sense amplifiers each provided for one pair of bit lines, the present invention can be applied to an SRAM having one sense amplifier commonly provided for the bit lines $BL_0, \overline{BL}_0, BL_1, \overline{BL}_1, \ldots, BL_{n-1}, \overline{BL}_{n-1}$, as illustrated in FIG. 13. In this case, transfer gates $Q_{T0}, \overline{Q}_{T0}, Q_{T1}, \overline{Q}_{T1}, \ldots, Q_{T, n-1}, \overline{Q}_{T, n-1}$ formed by P-channel MOS transistors are provided on the bit lines $BL_0, \overline{BL}_0, BL_1, \overline{BL}_1, \ldots, BL_{n-1}, \overline{BL}_{n-1}$, respectively, and are controlled by inverted signals of the column selection signals $Y_1, Y_2, \ldots, Y_{n-1}$, respectively. Also, a sense amplifier SA of FIG. 13 is constructed by a circuit as illustrated in FIG. 14.

Further, the present invention can be applied to an SRAM having a m rows×n columns matrix memory cell array (m≠n).

As explained hereinbefore, according to the present invention, since the difference in potential supplied to a sense amplifier is relatively small and uniform, a read operation margin can be improved. Simultaneously, a read operation speed can also be improved.

I claim:

1. A semiconductor memory device comprising:

a plurality of word lines;

a plurality of pairs of bit lines;

a plurality of static memory cells, each of said state memory cells being connected to a respective one of said word lines and one pair of said pairs of bit lines;

sense amplifier means, connected to said bit lines, for sensing a difference in potential between one of said pairs of bit lines; and a plurality of a resistive loads connected to a power supply, each of said resistive loads being connected at a substantially central location of one of said bit lines.

2. A device as set forth in claim 1, further comprising:

a word line selecting means, connected to said word lines, for selecting one of said word lines; and a bit line pair selecting means, connected to said pairs of bit lines, for selecting one pair of said pairs of bit lines, said sense amplifier means sensing a difference in potential between one of said pairs of bit lines selected by said bit line pair selecting means.

3. A semiconductor memory device, comprising:

a plurality of word lines;

a plurality of pairs of bit lines;

a plurality of static memory cells, each of said state memory cells being connected to a respective one of said word lines and one pair of said pairs of bit lines;

sense amplifier means, connected to said bit lines, for sensing a difference in potential between one of said pairs of bit lines;

a first plurality of first resistive loads connected to a power supply, each of said first resistive loads being connected at a substantially central location of one of said bit lines;

a second plurality of second resistive loads which are connected to a plurality of locations of each of said bit lines;

word line selecting means, connected to said word lines, for selecting one of said word lines;

bit line pair selecting means, connected to said pairs of bit lines, for selecting one of said pairs of bit lines; and resistive load selecting means, connected to said first and second resistive loads, for selecting and turning ON one of said first and second resistive loads per one bit line.

4. A device as set forth in claim 3, wherein said resistive load selecting means selects and turns ON one of said resistive loads per one bit line in synchronization with an operation of said word line selecting means.

5. A device as set forth in claim 4, wherein said resistive load selecting means selects one of said resistive loads per bit line close to one of said word lines selected by said word line selecting means.

6. A device as set forth in claim 3, further comprising a control means for selecting and turning ON a plurality of said resistive loads per one bit line in a read standby mode after a write operation.

7. A device as set forth in claim 1, wherein said sense amplifier means comprises a plurality of sense amplifiers each connected to one of said pairs of bit lines.

8. A device as set forth in claim 1, wherein said sense amplifier means comprises a sense amplifier connected to said pairs of bit lines.

9. A device as claimed in claim 1, wherein said plurality of static memory cells are arranged in columns, and wherein said substantially central location is at a location substantially equidistant between the ends of the column.

10. A device as claimed in claim 3, wherein said plurality of static memory cells are arranged in columns, and wherein said substantially central location is at a location substantially equidistant between the ends of the column.

* * * * *

UNITED STATES PATENT AND TRADEMARK OFFICE
CERTIFICATE OF CORRECTION

PATENT NO.   : 5,463,580
DATED        : October 31, 1995
INVENTOR(S)  : Kazuyuki NAKAMURA It is certified that error(s) appears in the above-identified patent and that said Letters Patent is hereby corrected as shown below:

Col. 3, line 23, delete "gages" and insert --gates--.

Col. 4, line 15, delete "$Q_2$" and insert --$Q_3$--.

Signed and Sealed this

Fourteenth Day of May, 1996

Attest:

BRUCE LEHMAN

Attesting Officer

Commissioner of Patents and Trademarks